United States Patent [19]
Witte

[11] Patent Number: 6,057,170
[45] Date of Patent: May 2, 2000

[54] METHOD OF MEASURING WAVINESS IN SILICON WAFERS

[75] Inventor: Dale Andrew Witte, O'Fallon, Mo.

[73] Assignee: MEMC Electronic Materials, Inc., St. Peters, Mo.

[21] Appl. No.: 09/264,230

[22] Filed: Mar. 5, 1999

[51] Int. Cl.$^7$ .......................... G01R 31/26; H01L 21/66
[52] U.S. Cl. ................................ 438/14; 438/15; 438/16; 438/17
[58] Field of Search ................................ 438/14, 15, 16, 438/17

[56] References Cited

U.S. PATENT DOCUMENTS

| | | |
|---|---|---|
| 5,159,202 | 10/1992 | Ametani . |
| 5,478,408 | 12/1995 | Mitani . |
| 5,735,258 | 4/1998 | Okuno et al. ........................ 125/16.02 |
| 5,774,222 | 6/1998 | Maeda et al. . |
| 5,920,398 | 7/1999 | Iwanaga et al. . |

OTHER PUBLICATIONS

ADE Corporation, UltraGage™ 9500 Operation Manual, Sep. 1, 1994, "Measurement Theory," pp. 3–10.

*Primary Examiner*—Kevin M. Picardat
*Assistant Examiner*—D. Maria Collins
*Attorney, Agent, or Firm*—Senniger, Powers, Leavitt & Roedel

[57] ABSTRACT

A method and system of measuring waviness of a silicon wafer. A memory stores data representative of the shape of the wafer at a plurality of positions on the wafer and a processor processes the data to determine a waviness parameter. The processor defines an inspection surface as a function of the data and calculates deviations between the inspection surface and a first reference plane at a plurality of positions on the inspection surface. The processor further defines a plurality of localized sites on the wafer and calculates deviations between the inspection surface and a second reference plane at a plurality of positions on the inspection surface for each site. The second reference plane is a function of the calculated deviations between the inspection surface for each site and the first reference plane. The processor then defines a waviness parameter for each site as a maximum variance of the calculated deviations between the inspection surface and the second reference plane.

17 Claims, 6 Drawing Sheets

METHOD OF MEASURING WAVINESS IN SILICON WAFERS

BACKGROUND OF THE INVENTION

This invention relates generally to wafer slicing and, particularly, to improved quality control in wafer slicing by accurately measuring waviness of the sliced wafers.

Most processes for fabricating semiconductor electronic components start with monocrystalline, or single crystal, silicon in the form of wafers. In general, semiconductor wafers are produced by thinly slicing a single crystal silicon ingot. After slicing, each wafer undergoes a number of processing operations to shape the wafer, reduce its thickness, remove damage caused by the slicing operation, and to create a highly reflective surface.

Known wafering processes include slicing an ingot into individual wafers with a cutting apparatus, such as a wire saw. In general, the wire saw uses a wire mounted on rollers for cutting the ingot. The drive mechanism of the wire saw moves the wire back and forth in a lengthwise direction around the rollers at an average speed of, for example, 600–900 meters per minute. Commonly assigned U.S. Pat. No. 5,735,258, the entire disclosure of which is incorporated herein by reference, discloses a wire saw apparatus for slicing silicon wafers.

Unfortunately, the wafer slicing process typically produces undesirable surface characteristics on a wafer such as thickness variations, warp, saw marks and kerf loss. Total thickness variation refers to the difference between the maximum measured thickness and the minimum measured thickness of the wafer. Warp refers to the difference between a maximum variance and a minimum variance from a standard surface of the wafer. Kerf loss refers to the loss of thickness of the wafer generated during cutting the wafer. ADE Corporation of Westwood, Mass. sells a non-contacting electric-capacity type sensor for characterizing wafer geometry (e.g., measuring total thickness variation and warp) under the trademark UltraGage® 9500. ADE Corporation also sells a wafer flatness measurement system under the trademark Galaxy AFS-300™.

The wafer slicing process also produces a waviness characteristic on the surface of the wafers, especially in wafers cut with a wire saw. In general, waviness refers to relatively localized surface variations. Although waviness is analogous to local changes in warp, presently available systems for measuring warp are not well suited for quantifying waviness. The undesirable surface characteristics resulting from wafer slicing usually can be satisfactorily reduced or eliminated by presently available post-slicing processing operations. However, such operations result in material loss and time inefficiencies. Therefore, further improvements in wafering processes are still desired. For example, measurements for waviness are needed to better understand this surface characteristic and to improve processes for reducing and/or eliminating waviness. Such measurements are also desired for determining whether a wafer has an unacceptable amount of waviness before undergoing further wafering processes. By reducing the problems associated with waviness, the wafering process may be simplified and its cost reduced.

SUMMARY OF THE INVENTION

The invention meets the above needs and overcomes the deficiencies of the prior art by providing an improved method and system for measuring waviness in wafers sliced from an ingot. Among the several objects and features of the present invention may be noted the provision of such method and system that permit waviness in wafers to be quantified; the provision of such method and system that permit the detection of wafers having an unacceptable amount of waviness; the provision of such method and system that simplify the wafering process and reduce its cost; and the provision of such method and system that are economically feasible and commercially practical.

Generally, one form of the invention is a method of measuring waviness of a silicon wafer. The method includes the steps of measuring shape data at a plurality of positions on the wafer and defining an inspection surface as a function of the measured shape data. The shape data is representative of a surface of the wafer. The method also includes calculating deviations between the inspection surface and a first reference plane at a plurality of positions on the inspection surface and determining a waviness parameter as a function of localized variations in the calculated deviations.

Another embodiment of the invention is directed to a method of inspecting a silicon wafer. The method includes the steps of measuring shape data at a plurality of positions on the wafer and defining an inspection surface as a function of the measured shape data. The shape data is representative of a surface of the wafer. The method also includes calculating deviations between the inspection surface and a first reference plane at a plurality of positions on the inspection surface. The method further includes defining a plurality of localized sites on the wafer and calculating deviations between the inspection surface and a second reference plane at a plurality of positions on the inspection surface for each site. The second reference plane is a function of the calculated deviations between the inspection surface for each site and the first reference plane. The method also includes the steps of defining a waviness parameter for each site as a maximum variance of the calculated deviations between the inspection surface and the second reference plane, calculating a statistical function of the waviness parameters for the wafer and determining a defective wafer when the statistical function of the waviness parameters for the wafer exceeds a threshold level representative of acceptable waviness.

Briefly described, a system embodying aspects of the invention measures waviness of a silicon wafer. The system includes a memory storing data representative of the shape of the wafer at a plurality of positions on the wafer and a processor for processing the stored data to determine a waviness parameter. The processor defines an inspection surface as a function of the stored data, calculates deviations between the inspection surface and a first reference plane at a plurality of positions on the inspection surface and determines the waviness parameter as a function of localized variations in the calculated deviations.

Alternatively, the invention may comprise various other methods and systems.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF PREFERRED EMBODIMENTS

Figure 1:
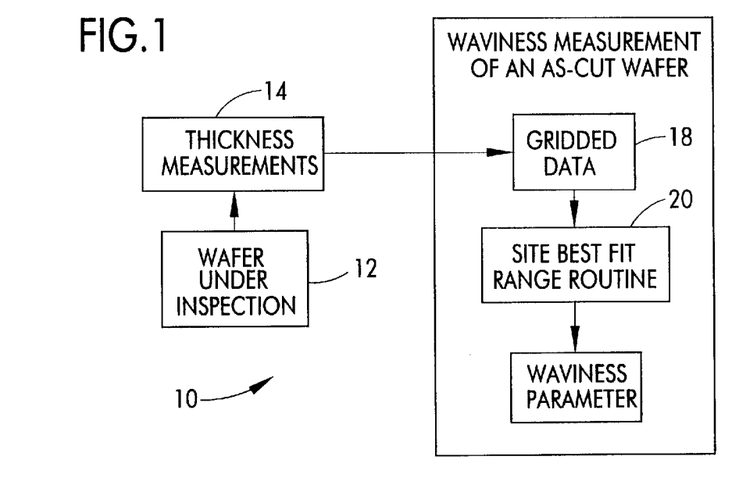
FIG. 1 is a block diagram of a system for measuring waviness of a silicon wafer according to a preferred embodiment of the invention.

Referring now to FIG. 1, a system 10 performs measurements on a wafer 12 to determine a waviness parameter. As described above, the wafer slicing process typically produces localized surface variations on the as-cut wafer 12. This undesirable characteristic, often referred to as waviness or undulations, usually can be satisfactorily reduced or eliminated by presently available post-slicing processing operations. Such operations, however, result both in the loss of semiconductor material and the loss of processing time. Advantageously, the system 10 quantifies the waviness of wafer 12 as a waviness parameter, which permits a better understanding of the surface characteristic.

In FIG. 1, a measurement station 14 accumulates shape data, which can be used to represent the thickness of wafer 12 as measured at a plurality of positions. For example, the measurement station 14 uses capacitive transducers, or probes, for measuring the distance from the probes to the top and bottom surfaces of wafer 12 (or front and back surfaces, depending on the wafer's orientation). The distance between the probes is generally fixed so that the wafer thickness can be calculated from the respective distances between the probes and wafer surfaces. In the alternative, the individual probe distances can be used to calculate an approximation of the true shape of the respective surfaces. Preferably, system 10 includes a memory 18 for storing a function of the accumulated data (e.g., thickness measurements) in the form of gridded data. As explained in detail below, the gridded data represents, for example, deviations between an inspection surface and a reference plane, both of which are defined as a function of wafer thickness measurements. ADE Corporation of Westwood, Mass. sells a non-contacting electric-capacity type sensor under the trademark UltraGage® 9500 suitable for measurement station 14.

A processor 20 executes software for implementing a site best fit range routine to determine localized variations in the gridded data. The waviness parameter of the as-cut wafer 12 under inspection is representative of these localized variations and provides a qualitative measure of the waviness on wafer 12. In this instance, the waviness parameter is relative to the severity of the waviness.

In one preferred embodiment of the invention, a wire saw manufactured by HCT Shaping Systems SA, using a BA150 feed spool manufactured by Bekaert Corporation, slices wafer 12 from its respective ingot. Preferably, the feed spool has a length of approximately 300 mm and a diameter of approximately 300 mm.

Figure 2A:
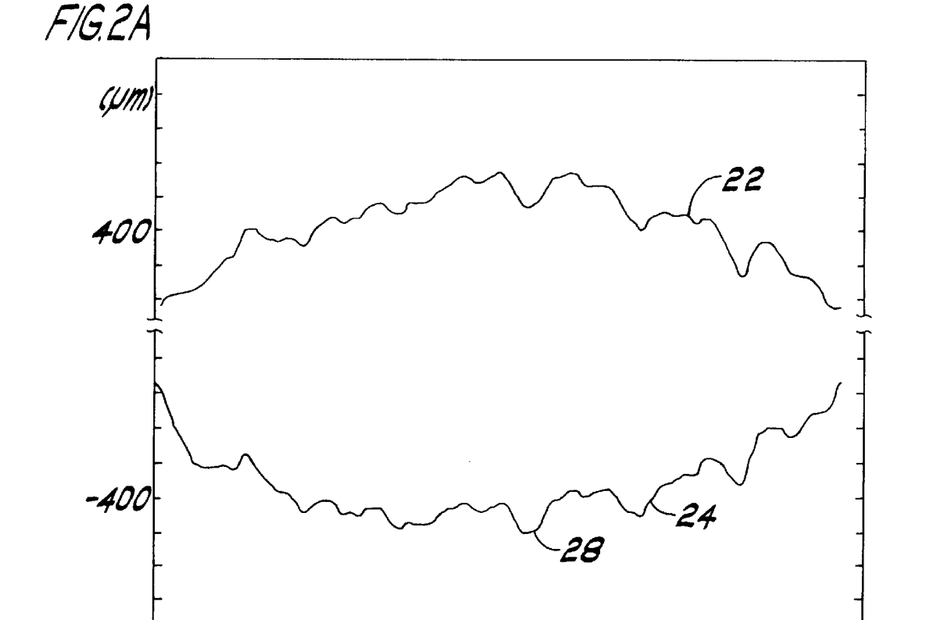
FIGS. 2A and 2B are exemplary wafer profiles for consecutive wafers sliced from an ingot using a wire saw.
Figure 2B:
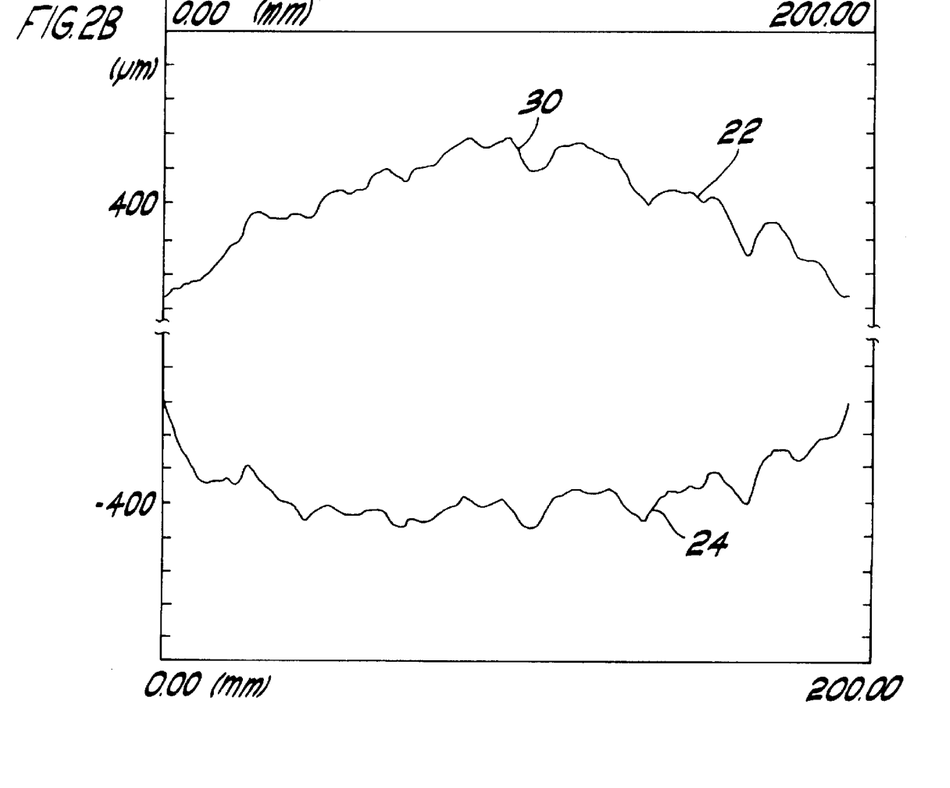

FIGS. 2A and 2B are exemplary surface profiles for consecutive wafers 12 sliced from an ingot using a wire saw. Each wafer 12 has a top surface 22 and a bottom surface 24. The thickness of wafers 12 (approximately 800 μm) is not shown in either FIGS. 2A or 2B. As shown in these figures, wafers 12 sliced consecutively from an ingot exhibit generally complementary waviness characteristics. For example, a peak 28 on the bottom surface 24 of one wafer 12 generally matches a corresponding valley 30 on the top surface 22 of the next wafer 12. FIGS. 2A and 2B also illustrate that the surface variations of interest are only about one to five microns in size.

Figure 3:
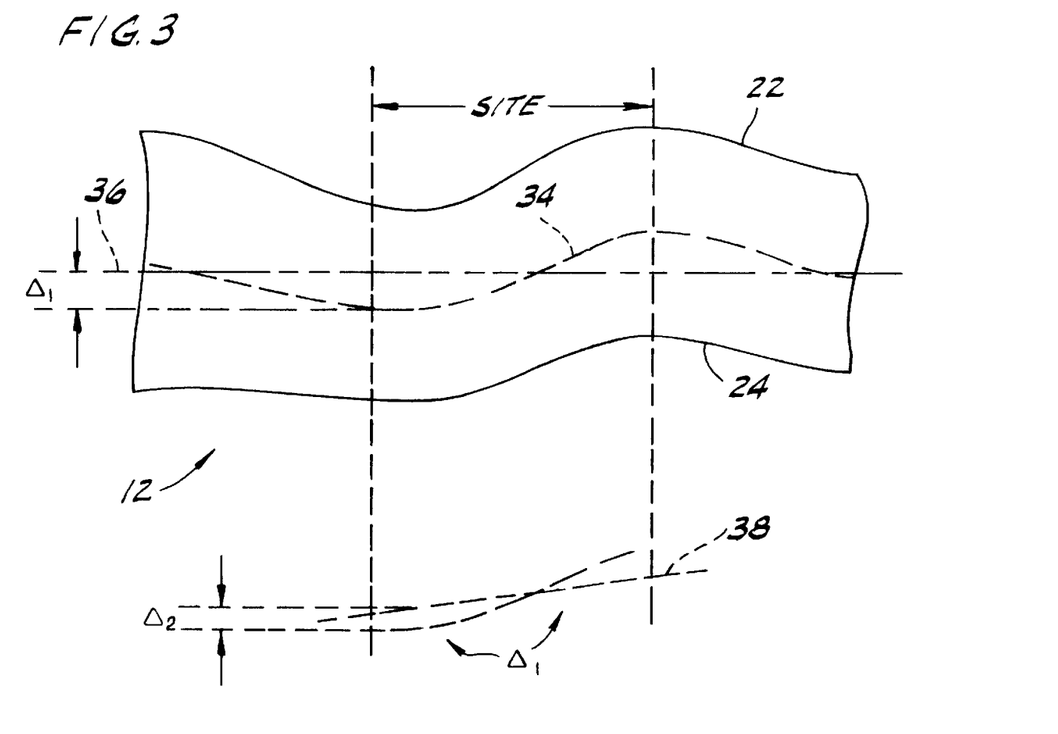
FIG. 3 is a fragmentary, enlarged side view of a wafer.

FIG. 3 provides a diagrammatic view of wafer 12. In one preferred embodiment of the invention, system 10 measures the waviness of wafer 12 by first measuring its shape data at a plurality of positions. Processor 20 processes the data to define an inspection surface 34. For example, a median surface between top surface 22 and bottom surface 24, as shown in FIG. 3, defines the inspection surface 34. In the alternative, either top surface 22 or bottom surface 24 itself defines inspection surface 34. Processor 20 then defines a first reference plane 36. In the illustrated embodiment, the reference plane 36 is a least squares best fit of inspection surface 34. In other words, reference plane 36 yields the lowest sum of the squares of the distances between it and each measured point on median inspection surface 34. In the alternative, processor 20 defines first reference plane 36 using the three-point method known in the art. According to the three-point method, reference plane 36 includes three points, spaced apart by 120°, on either top surface 22 or bottom surface 24 of wafer 12. Processor 20 then calculates the deviations between reference plane 36 and inspection surface 34 to accumulate gridded warp data concerning the as-cut wafer 12 under inspection. In general, the gridded data provides information regarding warp, which is a global feature relating to wafer 12 as a whole. It is to be understood that measurement station 14 may also include a processor for performing these operations. According to the present invention, processor 20 determines the waviness parameter of wafer 12 as a function of localized variations in the calculated deviations.

In determining the waviness parameter, processor 20 first defines a plurality of localized sites on wafer 12 and examines the gridded data for each of the sites. As an example, system 10 inspects 77 sites of 30×30 mm$^2$ for a 300 mm wafer. For each site, processor 20 defines a second reference plane 38 as a function of the calculated deviations between inspection surface 34 and first reference plane 36 for points in the particular site. Thus, it is likely that the second reference plane 38 for each site will be different. In a preferred embodiment, the least squares best fit of the gridded data for each site defines second reference plane 38 for the site.

According to the invention, processor 20 calculates the deviations between inspection surface 34 and second reference plane 38 at a plurality of positions on inspection surface 34 for each site. Processor 20 then defines the waviness parameter for each site as a maximum variance of the calculated deviations between inspection surface 34 and second reference plane 38. Advantageously, system 10 provides an indication of the acceptability of wafer 12 based on the waviness parameters for the various sites on the wafer 12. Processor 20 examines a statistic of the waviness parameters for making this determination.

Figure 4A:
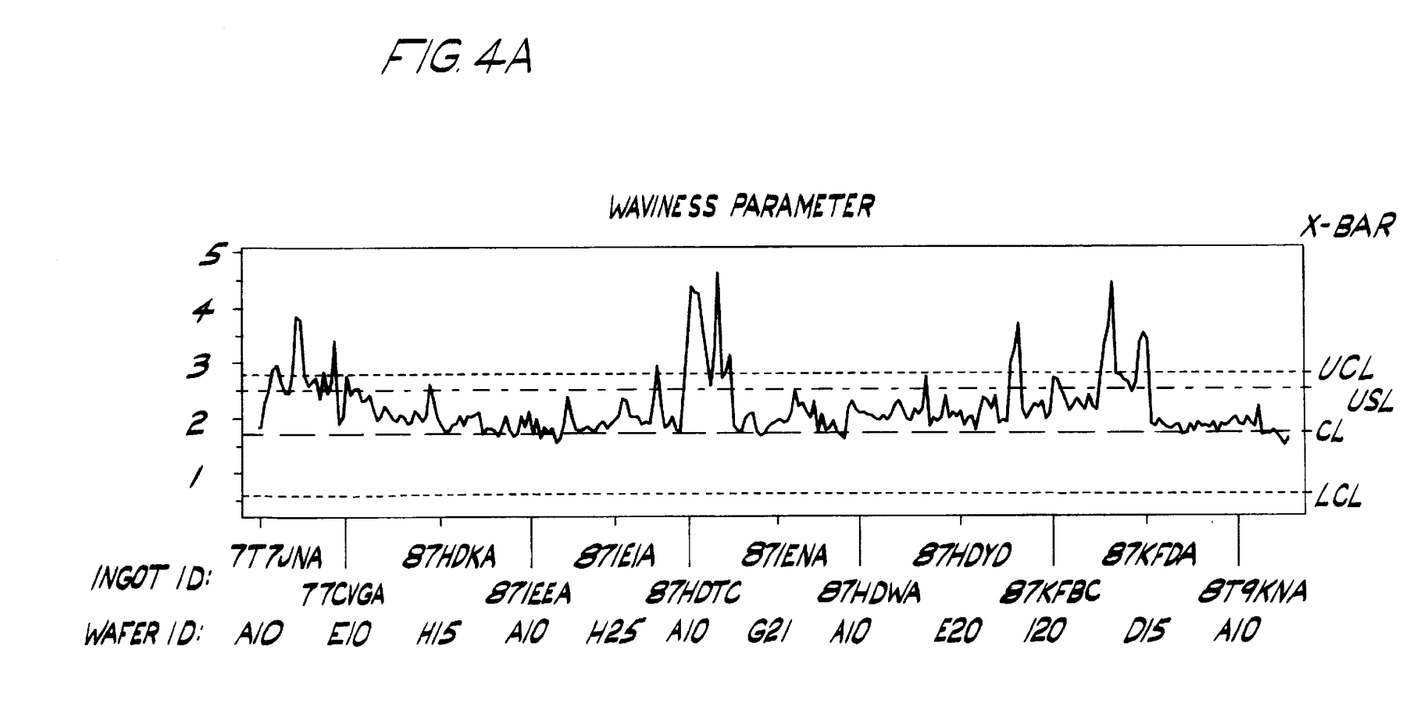
FIGS. 4A, 4B and 4C are exemplary graphs illustrating the mean, standard deviation and mean plus three standard deviations, respectively, of the waviness parameter for a sampling of wafers.
Figure 4B:
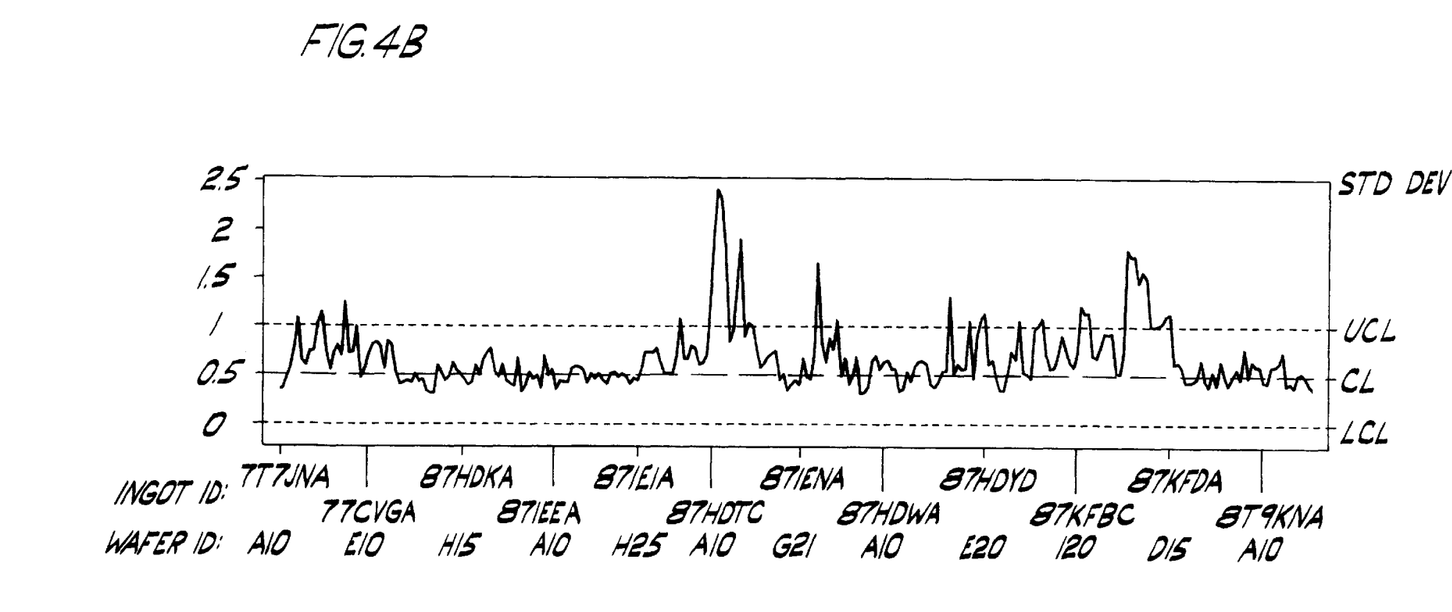
Figure 4C:
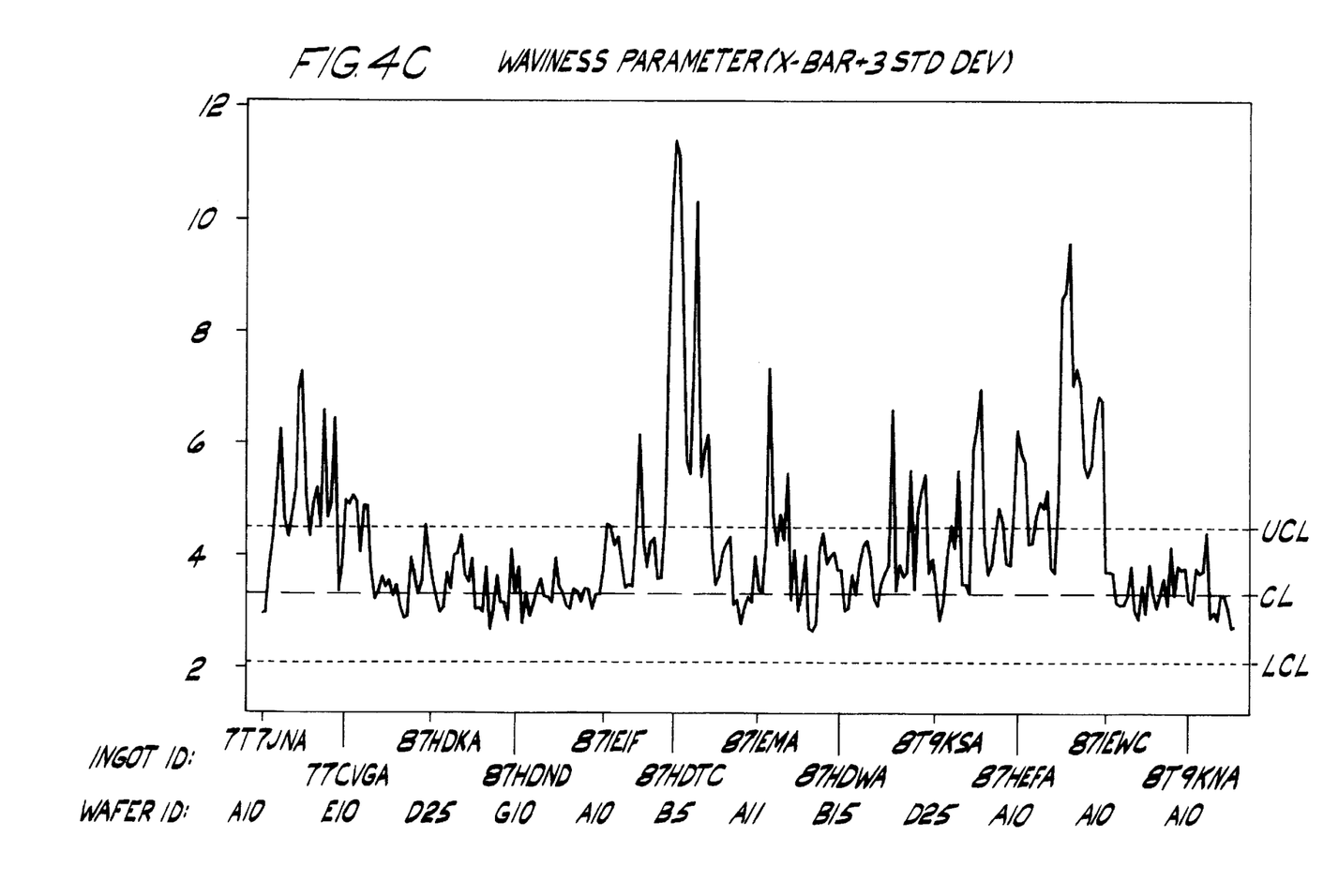

FIGS. 4A, 4B and 4C are exemplary graphs illustrating statistical functions of the waviness parameter for a sampling of wafers. In particular, FIG. 4A illustrates the mean waviness parameter for all of the sites for about 270 wafers and FIG. 4B illustrates the standard deviation of the waviness parameter for the sampling. FIG. 4C illustrates a waviness capability parameter providing an overall indication of the waviness of wafer 12. In this instance, system 10 defines the waviness capability parameter as the mean plus three standard deviations for the sampling. In determining whether wafer 12 is defective before undergoing additional processing operations to remove the undesirable waviness, processor 20 establishes an upper control limit for these statistics. One preferred embodiment of the invention rejects wafers having a waviness capability (mean plus three standard deviations) greater than approximately 4.5.

Figure 5:
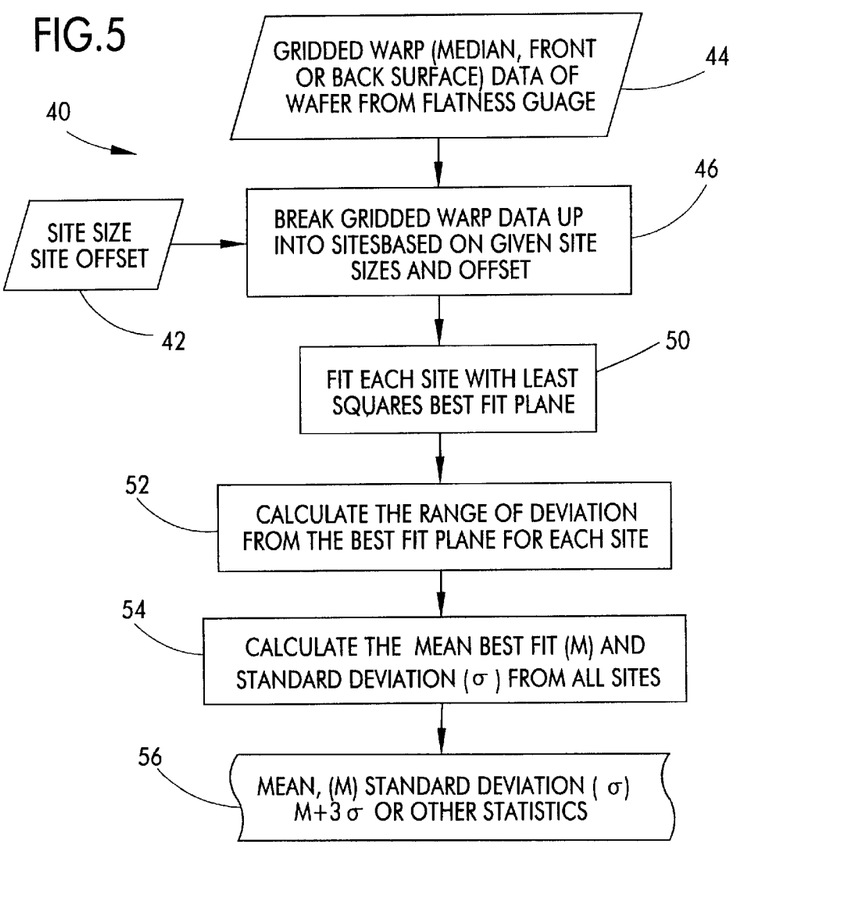
FIG. 5 is an exemplary flow diagram illustrating operation of the processor of FIG. 1 for determining a wafer waviness parameter.

Referring now to FIG. 5, an exemplary flow diagram 40 illustrates a preferred operation of the processor 20 for determining the waviness parameter of the as-cut wafer 12 under inspection. Beginning at step 42, processor 20 defines a plurality of localized sites on wafer 12 by size and offset from user input. As an example, a user selects the sites to be 30×30 mm$^2$ for a 300 mm wafer having a site centered about the center of wafer 12 (i.e., 15 mm offset in both the x and y directions). At step 44, processor 20 retrieves the gridded data for wafer 12 from memory 18 and, at step 46, examines the data for each of the sites. Proceeding to step 50, processor 20 defines the second reference plane 38 for each site as the least squares best fit plane for the gridded data corresponding to the particular site.

At step 52, processor 20 calculates the deviations between inspection surface 34 and second reference plane 38 for each site. Processor 20 defines the waviness parameter for each site as the range, or maximum variance, of the deviations between inspection surface 34 and second reference plane 38. Processor 20 provides an indication of the acceptability of wafer 12 based on the waviness parameters for all of the sites on the wafer 12 by examining a statistic of the parameters. At step 54, processor 20 calculates the mean waviness parameter and the standard deviation from all of the sites. In turn, processor 20 calculates a statistical function, such as the mean plus three standard deviations from all of the sites, for determining the waviness capability of the as-cut wafer 12 under inspection at step 56.

As described above, processor 20 executes software for implementing a site best fit range routine to determine localized variations in the gridded data. In a preferred embodiment of the invention, the site best fit range routine includes steps 44, 46, 50 and 52 and is similar to a Site Front Reference Least Squares Range (SFQR) algorithm for measuring site flatness.

The undesirable surface characteristics resulting from wafer slicing usually can be satisfactorily reduced or eliminated by presently available post-slicing processing operations. However, such operations result in material loss and time inefficiencies. Quantifying waviness with the waviness parameter or waviness capability provides a better understanding of this characteristic and, thus, permits improved operations for reducing and/or eliminating waviness during slicing rather than post-slicing. For example, proper control of the temperature, slurry, feed rate, cutting forces, wire quality and/or wire guide (main roller) life may lead to less waviness during slicing.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. A method of measuring waviness of a silicon wafer, said wafer having a top surface and a bottom surface, said method comprising the steps of:

measuring shape data at a plurality of positions on at least one of the surfaces of the wafer, said shape data being representative of surface variations of the wafer;

defining an inspection surface of the wafer as a function of the measured shape data;

calculating deviations between the inspection surface and a first reference plane at a plurality of positions on the inspection surface;

determining a waviness parameter as a function of localized variations in the calculated deviations to quantify the surface variations of the wafer.

2. The method of claim 1 wherein the step of defining the inspection surface includes defining a top surface and a bottom surface of the wafer from the measured shape data and defining a median surface between the top and bottom surfaces.

3. The method of claim 1 wherein the step of defining the inspection surface includes defining a top surface of the wafer from the measured shape data.

4. The method of claim 1 wherein the step of defining the inspection surface includes defining a bottom surface of the wafer from the measured shape data.

5. The method of claim 1 further comprising the step of defining the first reference plane as a least squares best fit of the inspection surface.

6. The method of claim 1 further comprising the step of defining the first reference plane to include three spaced-apart points on an outer surface of the wafer.

7. The method of claim 1 wherein the step of determining the waviness parameter comprises the steps of:

defining a plurality of localized sites on the wafer;

calculating deviations between the inspection surface and a second reference plane at a plurality of positions on the inspection surface for each site; and defining the waviness parameter for each site as a maximum variance of the calculated deviations between the inspection surface and the second reference plane.

8. The method of claim 7 further comprising the step of defining the second reference plane for each site as a function of the calculated deviations between the inspection surface for the site and the first reference plane.

9. The method of claim 7 further comprising the step of defining the second reference plane for each site as a least squares best fit of the calculated deviations between the inspection surface for the site and the first reference plane.

10. A method of inspecting a silicon wafer, said wafer having a top surface and a bottom surface, said method comprising the steps of:

measuring shape data at a plurality of positions on at least one of the surfaces of the wafer, said shape data being representative of surface variations of the wafer;

defining an inspection surface of the wafer as a function of the measured shape data;

calculating deviations between the inspection surface and a first reference plane at a plurality of positions on the inspection surface;

defining a plurality of localized sites on the wafer;

calculating deviations between the inspection surface and a second reference plane at a plurality of positions on the inspection surface for each site, said second reference plane being a function of the calculated deviations between the inspection surface for each site and the first reference plane;

defining a waviness parameter for each site as a maximum variance of the calculated deviations between the inspection surface and the second reference plane, said waviness parameter quantifying the surface variations of the wafer;

calculating a statistical function of the waviness parameters for the wafer; and determining a defective wafer when the statistical function of the waviness parameters for the wafer exceeds a threshold level representative of acceptable waviness.

11. The method of claim 10 wherein the step of defining the inspection surface includes defining a top surface and a bottom surface of the wafer from the measured shape data and defining a median surface between the top and bottom surfaces.

12. The method of claim 10 wherein the step of defining the inspection surface includes defining a top surface of the wafer from the measured shape data.

13. The method of claim 10 wherein the step of defining the inspection surface includes defining a bottom surface of the wafer from the measured shape data.

14. The method of claim 10 further comprising the step of defining the first reference plane as a least squares best fit of the inspection surface.

15. The method of claim 10 further comprising the step of defining the first reference plane to include three spaced-apart points on an outer surface of the wafer.

16. The method of claim 10 further comprising the step of defining the second reference plane for each site as a least squares best fit of the calculated deviations between the inspection surface for the site and the first reference plane.

17. The method of claim 10 wherein the statistical function is the mean of the waviness parameters plus three times the standard deviation of the waviness parameters.

* * * * *